(12) United States Patent
Cheng et al.

(10) Patent No.: US 8,928,094 B2
(45) Date of Patent: Jan. 6, 2015

(54) STRAINED ASYMMETRIC SOURCE/DRAIN

(75) Inventors: Chun-Fai Cheng, Hsinchu (TW);
Ka-Hing Fung, Hsinchu (TW);
Shyh-Wei Wang, Hsinchu (TW);
Chin-Te Su, Longtan Township,
Taoyuan county (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 508 days.

(21) Appl. No.: 12/875,834

(22) Filed: Sep. 3, 2010

(65) Prior Publication Data

US 2012/0056276 A1 Mar. 8, 2012

(51) Int. Cl.
| | |
|---|---|
| *H01L 29/78* | (2006.01) |
| *H01L 21/265* | (2006.01) |
| *H01L 21/266* | (2006.01) |
| *H01L 21/285* | (2006.01) |
| *H01L 21/8238* | (2006.01) |
| *H01L 29/165* | (2006.01) |
| *H01L 29/66* | (2006.01) |

(52) U.S. Cl.
CPC ...... *H01L 29/7848* (2013.01); *H01L 21/26586* (2013.01); *H01L 21/266* (2013.01); *H01L 21/28525* (2013.01); *H01L 21/823807* (2013.01); *H01L 21/823814* (2013.01); *H01L 21/823828* (2013.01); *H01L 29/165* (2013.01); *H01L 29/66545* (2013.01); *H01L 29/66659* (2013.01); *H01L 29/7835* (2013.01); *H01L 29/6656* (2013.01)
USPC .................................. 257/408; 257/E29.268

(58) Field of Classification Search
USPC .................................. 257/E29.268, E29.279
See application file for complete search history.

(56) References Cited

U.S. PATENT DOCUMENTS

| | | | | |
|---|---|---|---|---|
| 5,831,306 | A | * | 11/1998 | Gardner et al. ............... 257/344 |
| 6,010,936 | A | * | 1/2000 | Son .............................. 438/303 |
| 6,180,502 | B1 | | 1/2001 | Liang |
| 6,384,457 | B2 | | 5/2002 | Tyagi et al. |
| 6,596,594 | B1 | | 7/2003 | Guo |
| 7,964,910 | B2 | * | 6/2011 | Dyer ............................. 257/327 |
| 2003/0227029 | A1 | * | 12/2003 | Lochtefeld et al. ........... 257/200 |
| 2006/0043498 | A1 | * | 3/2006 | Orlowski et al. ............. 257/396 |
| 2006/0131656 | A1 | * | 6/2006 | Shin et al. ..................... 257/369 |
| 2006/0138398 | A1 | * | 6/2006 | Shimamune et al. ........... 257/19 |
| 2007/0138570 | A1 | * | 6/2007 | Chong et al. .................. 257/371 |
| 2008/0157365 | A1 | * | 7/2008 | Ott et al. ....................... 257/750 |
| 2009/0032845 | A1 | * | 2/2009 | Zhu et al. ...................... 257/192 |
| 2009/0152634 | A1 | * | 6/2009 | Grant ............................ 257/368 |

* cited by examiner

*Primary Examiner* — Benjamin Sandvik
(74) *Attorney, Agent, or Firm* — Haynes and Boone, LLP

(57) ABSTRACT

The present disclosure provides a semiconductor device and methods of making wherein the semiconductor device has strained asymmetric source and drain regions. A method of fabricating the semiconductor device includes providing a substrate and forming a poly gate stack on the substrate. A dopant is implanted in the substrate at an implant angle ranging from about 10° to about 25° from perpendicular to the substrate. A spacer is formed adjacent the poly gate stack on the substrate. A source region and a drain region are etched in the substrate. A strained source layer and a strained drain layer are respectively deposited into the etched source and drain regions in the substrate, such that the source region and the drain region are asymmetric with respect to the poly gate stack. The poly gate stack is removed from the substrate and a high-k metal gate is formed using a gate-last process where the poly gate stack was removed.

20 Claims, 13 Drawing Sheets

STRAINED ASYMMETRIC SOURCE/DRAIN

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

Continued reduction of size in semiconductor devices causes design trade-offs for device performance, such as drive current versus junction leakage. For example, in a field-effect transistor (FET) device, a source-side characteristic is that a smaller proximity yields a higher drive current due to a higher stress. A drain-side characteristic is that a smaller proximity causes a higher junction leakage. In addition, semiconductor devices, such as FET devices, are generally constructed using a vertical implantation process of dopants in the substrate. This causes the device to have substantially symmetric source/drain (S/D) structures in the substrate. As such, it is a design challenge to optimize both drive current performance and junction leakage.

Thus, it is desirable to have a strained asymmetric source/drain semiconductor device addressing one or more of the issues discussed above.

SUMMARY

The present disclosure provides a semiconductor device and methods of making wherein the semiconductor device has strained asymmetric source and drain regions. In an embodiment, a method of fabricating a semiconductor device includes providing a substrate and forming a poly gate stack on the substrate. A dopant is implanted in the substrate at an implant angle ranging from about 10° to about 25° from perpendicular to the substrate. A spacer is formed adjacent the poly gate stack on the substrate. A source region and a drain region are etched in the substrate. A strained source layer and a strained drain layer are respectively deposited into the etched source and drain regions in the substrate, such that the source region and the drain region are asymmetric with respect to the poly gate stack. The poly gate stack is removed from the substrate and a high-k metal gate is formed using a gate-last process where the poly gate stack was removed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
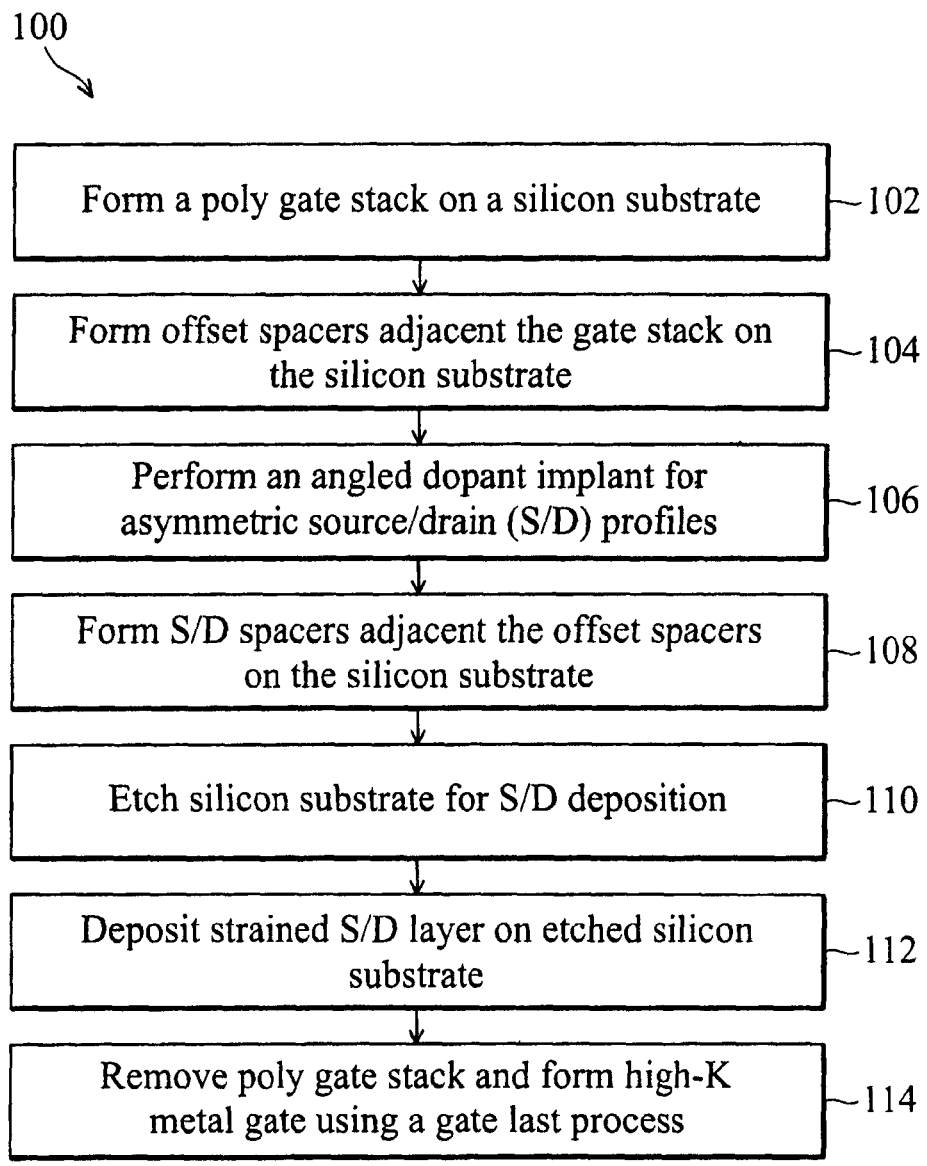
FIG. 1 is a flowchart illustrating an embodiment of a method for forming a strained asymmetric source/drain semiconductor device.
Figure 2:
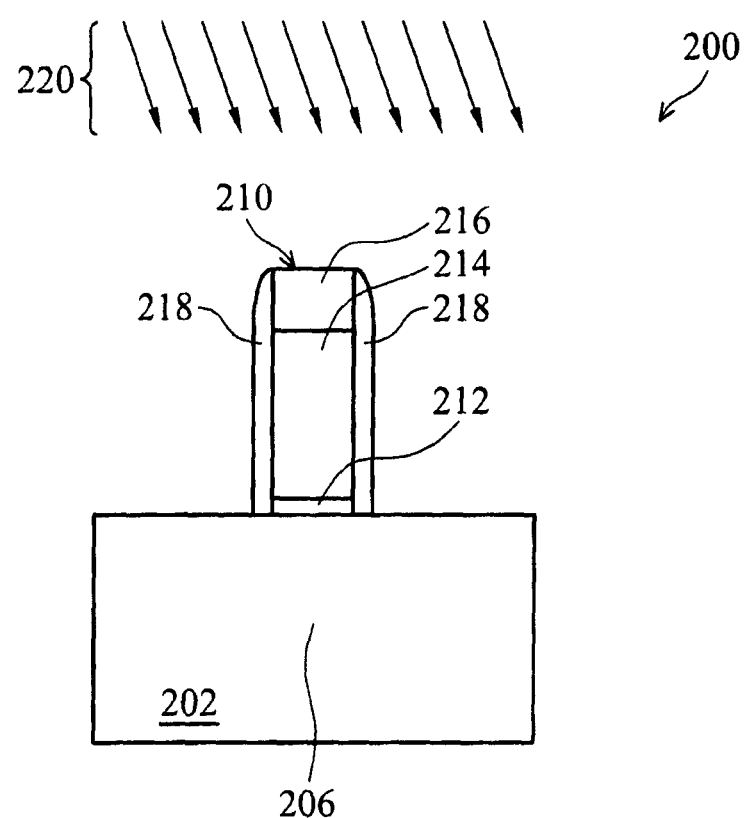
FIGS. 2-7 illustrate cross sectional views of an embodiment of a semiconductor device having a drain-to-source angled implantation, the device is shown at various stages of fabrication according to the method of FIG. 1.

Illustrated in FIG. 1 is a flowchart of a method 100 for forming asymmetrical source drain (S/D) regions in a semiconductor device according to various aspects of the present disclosure. FIGS. 2-7 are cross sectional views of a semiconductor device 200 at various stages of fabrication according to the method 100 of FIG. 1. FIGS. 8-13 are cross sectional views of another embodiment of a semiconductor device 1200 at various stages of fabrication according to the method 100 of FIG. 1. It should be understood that embodiments provided herein may be formed using a high-k metal gate (HKMG), gate last process. In other words, the semiconductor device 200 may be fabricated in a gate last process (also referred to as a replacement poly gate process (RPG)). In a gate last process, a dummy dielectric and dummy poly gate structure may be initially formed and may be followed by a normal CMOS process flow until deposition of an interlayer dielectric (ILD). The dummy dielectric and dummy poly gate structure may then be removed and replaced with a high-k gate dielectric/metal gate structure.

The semiconductor devices 200 and/or 1200 may be formed as an integrated circuit, or a portion thereof, that may comprise memory circuits and/or logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor devices 200 and/or 1200 may be fabricated with a CMOS process flow. Accordingly, it is understood that additional processes may be provided before, during, and after the method 100 of FIG. 1, and that some other processes may only be briefly described herein. It is also to be understood that the description includes terms like "on" which may refer to layers being formed "on" other layers. However, the different layers may actually be formed on and/or in one another. In addition, the different layers may or may not be touching and may included layers between the different layers.

Referring now to the embodiments shown in FIGS. 2-7, the method 100 begins at block 102 where a semiconductor device 200 is formed on a substrate 202. The substrate 202 may include various doping configurations depending on design requirements as may be known in the art. The substrate 202 may also include other elementary semiconductors such as germanium, silicon germanium and III-V semiconductor substrate, such as GaAs, InGaAs, or other suitable materials. Alternatively, the substrate 202 may include a compound semiconductor and/or an alloy semiconductor. In the present embodiment, the substrate 202 includes a silicon material, such as a silicon substrate. In operation, the device 200 may have an active region 206 in the substrate 202.

A dummy gate stack 210 is formed over the active region 206 on the substrate 202. In an embodiment, the gate stack 210 includes a high-k dielectric layer 212, a polysilicon dummy gate layer 214, and a hard mask layer 216. The high-k dielectric layer 212 may include hafnium oxide (HfO$_x$). Alternatively, the high-k dielectric layer 212 may optionally include other high-k dielectrics such as LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides, or other suitable materials. The high-k dielectric layer 212 may include a thickness ranging from about 10 to about 40 angstrom (A). The high-k dielectric layer 212 may be formed by atomic layer deposition (ALD) or other suitable technique. The dummy polysilicon (or poly) layer 214 is formed over the dielectric layer 212 by a suitable deposition process. For example, silane (SiH$_4$), di-silane (Si$_2$H$_6$), or di-clorsilane (SiCl$_2$H$_4$) may be used as a chemical gas in a CVD process to form the poly layer 214. The poly layer 214 may include a thickness ranging from about 400 to about 2000 angstrom (A). However, other thickness may be used for the poly layer 214. Alternatively, an amorphous silicon layer may optionally be formed instead of the polysilicon layer.

The gate stack 210 also includes a hard mask layer 216 formed on the gate electrode 214. The hard mask layer 216 may include a dielectric material such as silicon oxide, silicon nitride, silicon oxynitride, or silicon carbide. In the present embodiment, the hard mask layer 216 includes silicon oxide. Other elements may be used for the hard mask layer 216.

Overall, the gate stack 210 may have a thickness ranging from about 800 to about 1400 angstrom (A). As should be readily understood by those having ordinary skill in the art, the thickness range of the gate stack 210 may be modified to accommodate for different implant distances into the active region 206 depending on an implant angle, as described in more detail below.

In an alternative embodiment, the gate stack 210 may be formed to include a gate electrode formed over the high-k dielectric layer 212. The gate electrode may include any metal material suitable for forming a metal gate or portion thereof, including work function layers, liner layers, interface layers, seed layers, adhesion layers, barrier layers, etc. For example, the metal layer may include TiN, TaN, ZrN, HfN, VN, NbN, CrN, MoN, WN, TiAl, TiAlN, or combinations thereof. The gate electrode may be formed by ALD, physical vapor deposition (PVD or sputtering), chemical vapor deposition (CVD), or other suitable processes. The gate electrode may further include multiple layers, such as, an active material layer formed over the metal layer. The active material layer may be a metal layer and may include Al, Cu, W, Ti, Ta, Cr, V, Nb, Zr, Hf, Mo, Ni, Co, or combinations thereof. The active material layer may be formed by various deposition techniques such as PVD, CVD, ALD, plating, or other suitable techniques. A silicide layer may be formed over the gate electrode to reduce contact resistance.

The gate stack 210 may also include an interfacial layer (not shown) formed over the substrate 202. The interfacial layer may include silicon oxide (SiO$_2$) or silicon oxynitride (SiON) having a thickness of about 5 to about 50 angstrom (A).

The semiconductor device 200 may further include an isolation structure, such as a shallow trench isolation (STI) feature (not shown) formed in the substrate 202 for isolating multiple active regions (e.g., active region 206) in the substrate 202, as should be understood in the art. The isolation structure may include a dielectric material and may be formed of silicon oxide, silicon nitride, silicon oxynitride, fluoride-doped silicate (FSG), and/or a low-k dielectric material known in the art. In varying embodiments, the active region 206 may be configured for an N-type metal-oxide-semiconductor transistor device (referred to as NMOS), or a P-type metal-oxide-semiconductor transistor device (referred to as PMOS).

The method 100 proceeds to block 104 where offset spacers 218 are formed along side of the gate stack 210 on the substrate 202. The offset spacers 218 may include a dielectric material such as silicon nitride or silicon oxide. In the present embodiment, the offset spacers 218 include silicon nitride. The offset spacers 218 may be formed by depositing a spacer layer over the gate stack 210 and the substrate 202, and then performing a dry etching process on the spacer 218.

Figure 3:
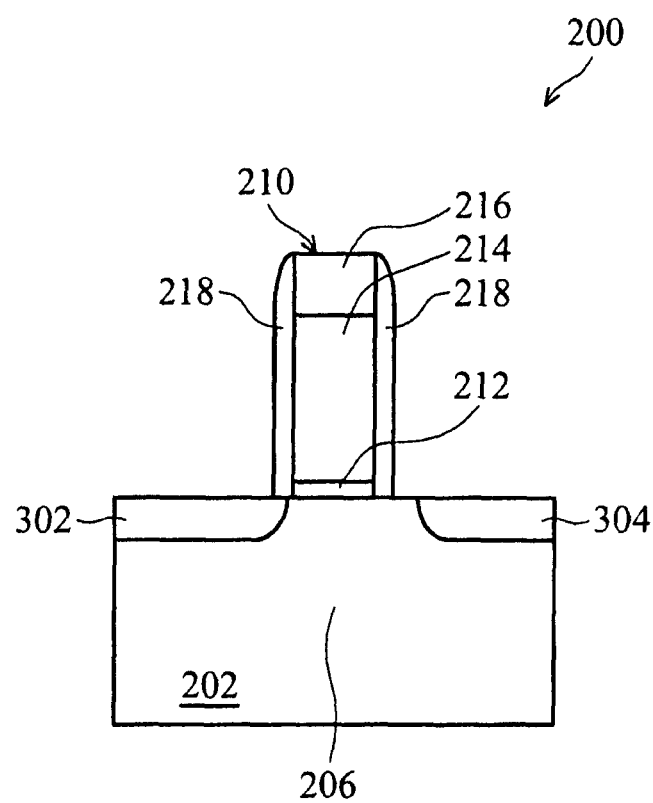
Figure 4:
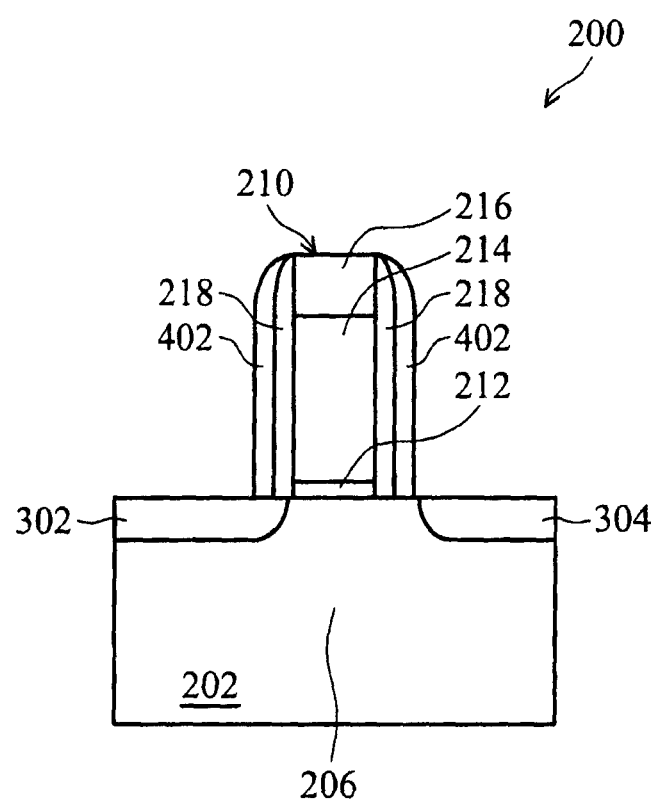

The method 100 then proceeds to block 106 where an angled dopant implant 220 (from drain side down and toward source side) is performed on the device 200 to form asymmetric source/drain profiles. Implant dopant, such as boron or BF2, with etching retardation property is used. Using the geometry of the gate stack 210 height, the offset spacer 218 width, and the implant angle (with respect to vertical to the device 200), the source/drain regions are formed asymmetrically. In other words, as shown in FIG. 3, the drain side 302 of the implant 220 will extend into the substrate 202 under the offset spacer 218 and the source side 304 of the implant 220 will be into the substrate 202, but will be extended a distance laterally from the gate stack 210 and/or the spacer 218. In an embodiment, the implant 220 is at an angle range from about 10° to about 25° from vertical or normal to the device 200. In an embodiment, BF2 is implanted at an energy range of about 0.5keV to about 5keV at a dose range from about 1E14 cm-2 to about 3E15 cm-2. However, other elements, angles, energies and dosages may be used with the present disclosure.

The method 100 continues to block 108 where source/drain (S/D) spacers 402 are formed along side of the offset spacers 218 on the substrate 202. See for example FIG. 4. The S/D spacers 402 may include a dielectric material such as silicon nitride or silicon oxide. In the present embodiment, the S/D spacers 402 include silicon nitride. The S/D spacers 402 may be formed by depositing a spacer layer over the gate stack 210, the offset spacers 218, and the substrate 202, and then performing a dry etching process on the spacers 402.

Figure 5:
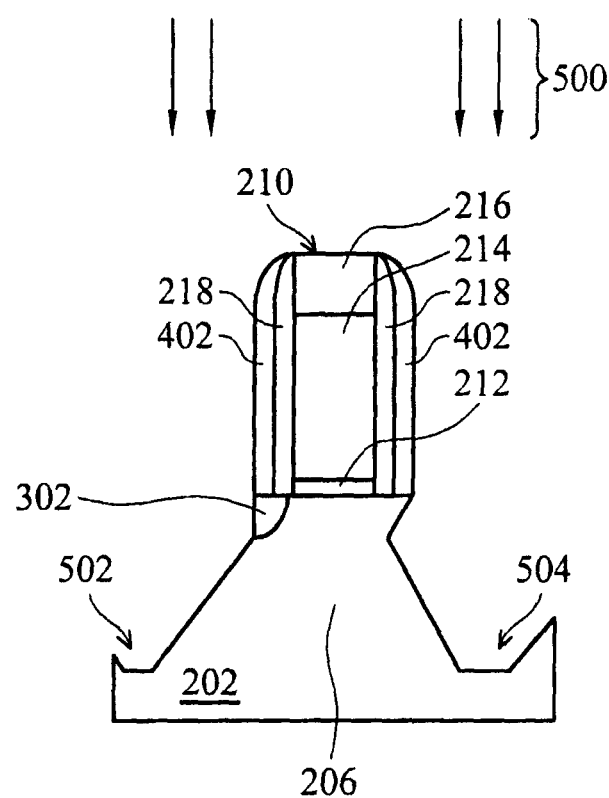

As shown in FIG. 5, the method 100 continues to block 110 where an etching process 500 forms a recessed drain region 502 and a recessed source region 504 in the substrate 202. The etching 500 may be a combined etching process including a dry plasma etching and a wet tetra-methyl ammonium hydroxide (TMAH) etching performed using a concentration range of about 1% to about 10% at a temperature range of about 15 C to about 25 C. However, other etching processes may be used with the present disclosure. Because the drain side implant 302 is located partially under the offset spacer 218 and possibly partially under the gate stack 210 (e.g., due to the angled implant 220) and the source side implant 304 is not under the spacer 218 (e.g., due to blocking of the angled implant 220 by the gate stack 210, as shown in FIG. 5, the etching process 500 etches away all of the source side implant 304, but leaves a portion of the drain side implant 302. The implant dopant (with etching retardation property as mentioned above) retards the etching rate in the drain side. As such, asymmetric drain and source profiles may be formed.

Figure 6:
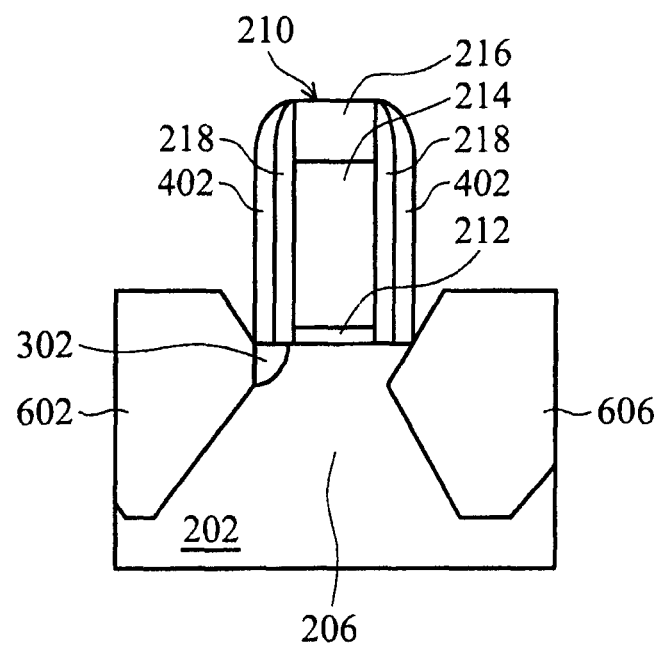
Figure 7:
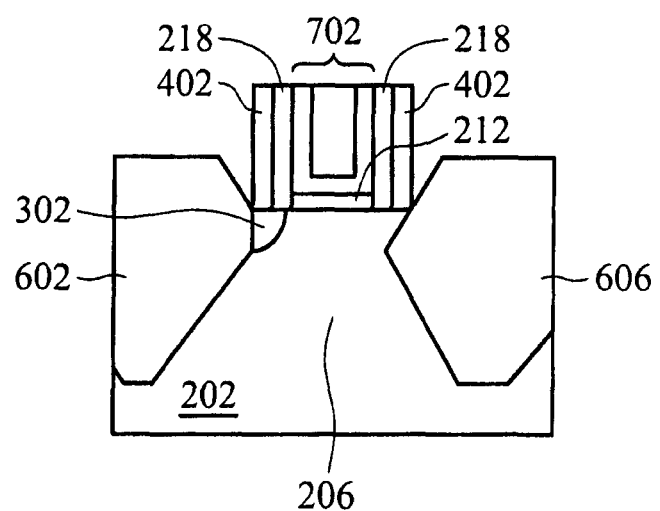
Figure 8:
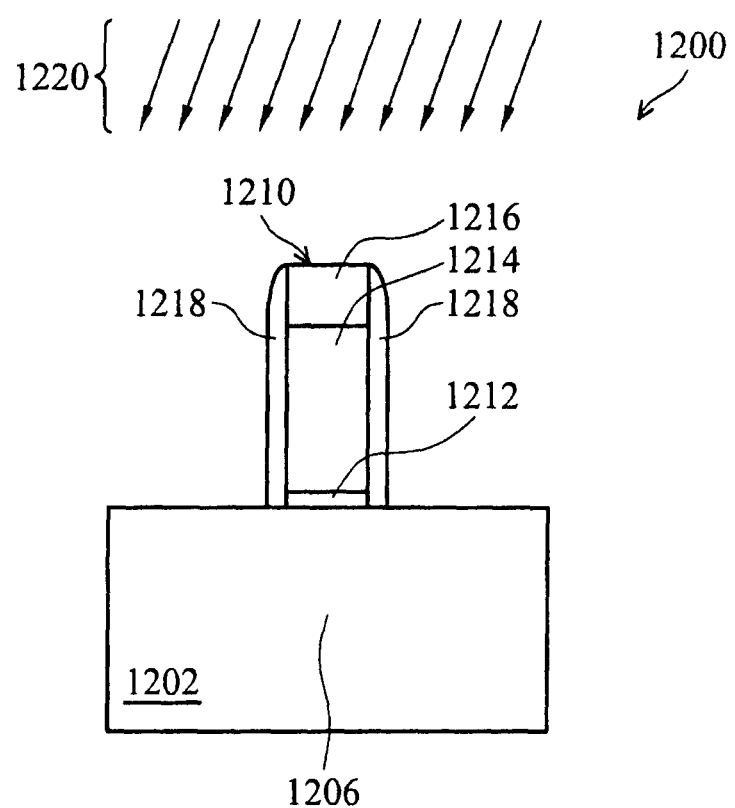
FIGS. 8-13 illustrate cross sectional views of an embodiment of a semiconductor device having a source-to-drain angled implantation, the device is shown at various stages of fabrication according to the method of FIG. 1.

The method 100 proceeds to block 112 where strained drain layer 602 and also strained source layer 606 are deposited in the respective drain and source regions 502, 504 etched in block 110. An embodiment of this is shown in FIG. 6. It is understood that modulating strain in a transistor channel enhances electron and hole mobility and thus conductivity through the channel. Silicon germanium (SiGe) may be deposited to provide compressive strain in pFET, whereas silicon carbide (SiC) may be deposited to provide tensile strain in nFET. Other methods and systems for straining the source and drain may be used with the present disclosure. It is also pointed out that the drain layer 602 and the source layer 606 are symmetric due to the asymmetric profiles formed in recess etching. In an embodiment, the drain deposition 602 and the source deposition 606 may be formed in block 112 when a semiconductor material is epi-grown using one or more chemical-vapor deposition (CVD) processes and may be formed using silicon germanium, silicon carbide, and/or combinations thereof. An advantage of the present embodiment is enhanced carrier mobility due to the strained feature. Additionally, the strained feature may be raised above the substrate 202, as can be seen at 602 and 606.

The method 100 proceeds to block 114 where at least a portion of the gate stack 210 is removed by chemical vapor deposition (CVD) and/or by etching and a high-k metal gate 702 is formed using high-k metal gate, gate last processes.

It should be understood that the spacers 218 and/or 402 may be removed by an etching process. After the spacers 218, 402 are etched away, lightly doped source/drain (referred to as LDD) regions may be formed in the substrate 202 on either side of the gate stack 210 by an ion implantation or diffusion process as is known in the art. In one embodiment, the active region 206 may be a PMOS device, and P-type dopants such as BF2 or boron may be implanted in the PMOS device. In another embodiment, the active region 206 may be an NMOS device, and N-type dopants such as phosphorus or arsenic may be implanted in the NMOS. A portion of the LDD regions may be formed in the silicon substrate 202, and another portion of the LDD regions may be formed in the semiconductor material in the recess regions. It should be understood that LDD regions may be formed using the method 100 after block 102 or after block 112.

It is also to be understood that other layers may be formed over the gate stack 210 and/or the substrate 202 and/or the semiconductor material 602 and/or 606. For example, layers may be formed by CVD, ALD, or other suitable technique. The layers may include an oxide material, such as silicon oxide, silicon nitride.

It is understood that the method 100 may continue with additional steps to complete the fabrication of the semiconductor device 200. For example, other heavy doped source/drain regions may be formed in the substrate 202 on either side of the gate stack 210 using ion implantation or diffusion with suitable N-type or P-type dopants. The heavy doped source/drain regions may be substantially aligned with the outer sides of the features. Silicide features may be formed on the source/drain regions and the poly layer by a salicidation process. A contact etch stop layer (CESL) may be formed over the substrate. An interlayer dielectric (ILD) layer may be formed over the CESL. In addition, contacts and interconnects may also be formed to establish electrical connections for the semiconductor device 200.

Referring now to the embodiments shown in FIGS. 8-13, the method 100 begins at block 102 where a semiconductor device 1200 is formed on a substrate 1202. The substrate 1202 may include various doping configurations depending on design requirements as may be known in the art. The substrate 1202 may also include other elementary semiconductors such as germanium and diamond. Alternatively, the substrate 1202 may include a compound semiconductor and/or an alloy semiconductor. In the present embodiment, the substrate 1202 includes a silicon material, such as a silicon substrate. In operation, the device 1200 may have an active region 1206 in the substrate 1202.

A dummy gate stack 1210 is formed over the active region 1206 on the substrate 1202. In an embodiment, the gate stack 1210 includes a high-k dielectric layer 1212, a polysilicon dummy gate layer 1214, and a hard mask layer 1216. The high-k dielectric layer 1212 may include hafnium oxide ($HfO_x$). Alternatively, the high-k dielectric layer 1212 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. The high-k dielectric layer 1212 may include a thickness ranging from about 10 to about 40 angstrom (A). The high-k dielectric layer 1212 may be formed by atomic layer deposition (ALD) or other suitable technique. The dummy polysilicon (or poly) layer 1214 is formed over the dielectric layer 1212 by a suitable deposition process. For example, silane ($SiH_4$), di-silane ($Si_2H_6$), or di-clorsilane ($SiCl_2H_4$) may be used as a chemical gas in a CVD process to form the poly layer 1214. The poly layer 1214 may include a thickness ranging from about 400 to about 2000 angstrom (A). However, other thickness may be used for the poly layer 1214. Alternatively, an amorphous silicon layer may optionally be formed instead of the polysilicon layer.

The gate stack 1210 also includes a hard mask layer 1216 formed on the gate electrode 1214. The hard mask layer 1216 may include a dielectric material such as silicon oxide, silicon nitride, silicon oxynitride, or silicon carbide. In the present embodiment, the hard mask layer 1216 includes silicon oxide. Other elements may be used for the hard mask layer 1216.

Overall, the gate stack 1210 may have a thickness ranging from about 800 to about 1400 angstrom (A). As should be readily understood by those having ordinary skill in the art, the thickness range of the gate stack 1210 may be modified to accommodate for different implant distances into the active region 1206 depending on an implant angle, as described in more detail below.

In an alternative embodiment, the gate stack 1210 may be formed to include a gate electrode formed over the high-k dielectric layer 1212. The gate electrode may include any metal material suitable for forming a metal gate or portion thereof, including work function layers, liner layers, interface layers, seed layers, adhesion layers, barrier layers, etc. For example, the metal layer may include TiN, TaN, ZrN, HfN, VN, NbN, CrN, MoN, WN, TiAl, TiAlN, or combinations thereof. The gate electrode may be formed by ALD, physical vapor deposition (PVD or sputtering), chemical vapor deposition (CVD), or other suitable processes. The gate electrode may further include multiple layers, such as, an active material layer formed over the metal layer. The active material layer may be a metal layer and may include Al, Cu, W, Ti, Ta, Cr, V, Nb, Zr, Hf, Mo, Ni, Co, or combinations thereof. The active material layer may be formed by various deposition techniques such as PVD, CVD, ALD, plating, or other suitable techniques. A silicide layer may be formed over the gate electrode to reduce contact resistance.

The gate stack 1210 may also include an interfacial layer (not shown) formed over the substrate 1202. The interfacial layer may include silicon oxide ($SiO_2$) or silicon oxynitride (SiON) having a thickness of about 5 to about 50 angstrom (A).

The semiconductor device 1200 may further include an isolation structure, such as a shallow trench isolation (STI) feature (not shown) formed in the substrate 1202 for isolating multiple active regions (e.g., active region 1206) in the substrate 1202, as should be understood in the art. The isolation structure may include a dielectric material and may be formed of silicon oxide, silicon nitride, silicon oxynitride, fluoride-doped silicate (FSG), and/or a low-k dielectric material known in the art. In varying embodiments, the active region 1206 may be configured for an N-type metal-oxide-semiconductor transistor device (referred to as NMOS), or a P-type metal-oxide-semiconductor transistor device (referred to as PMOS).

The method 100 proceeds to block 104 where offset spacers 1218 are formed along side of the gate stack 1210 on the substrate 1202. The offset spacers 1218 may include a dielectric material such as silicon nitride or silicon oxide. In the present embodiment, the offset spacers 1218 include silicon nitride. The offset spacers 1218 may be formed by depositing a spacer layer over the gate stack 1210 and the substrate 1202, and then performing a dry etching process on the spacer 1218.

Figure 9:
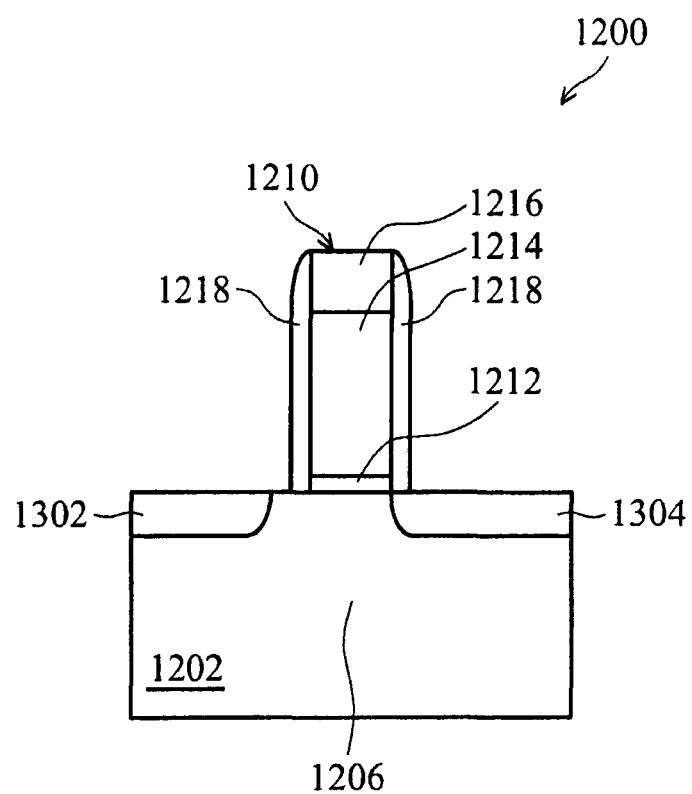
Figure 10:
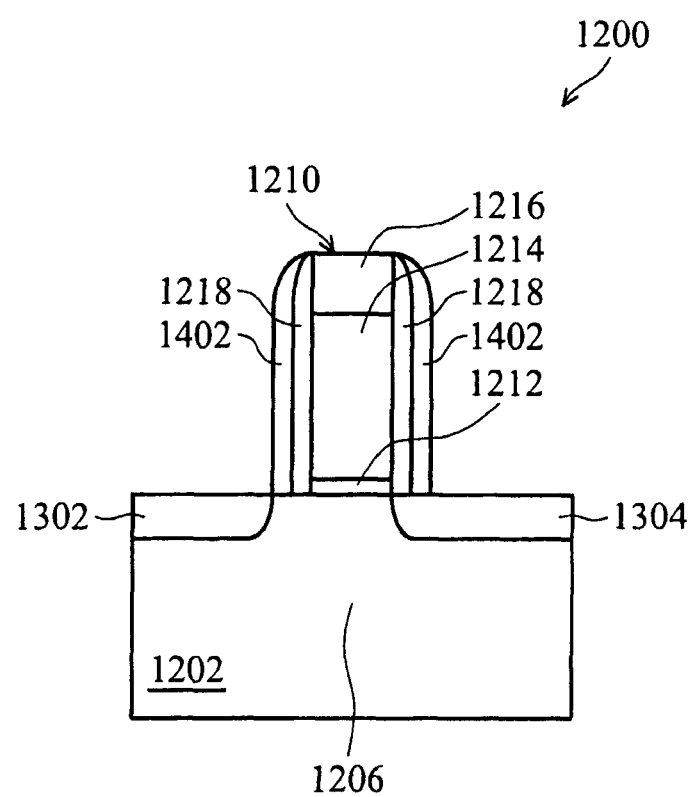

The method 100 then proceeds to block 106 where an angled dopant implant 1220 (from source side down and toward drain side) is performed on the device 1200 to form asymmetric source/drain profiles. An implant dopant, such as arsenic, with an etching enhancement property may be used. Using the geometry of the gate stack 1210 height, the offset spacer 1218 width, and the implant angle (with respect to vertical to the device 1200), the source/drain regions are formed asymmetrically. In other words, as shown in FIG. 9, the source side 1304 of the implant 1220 will extend into the substrate 1202 under the offset spacer 1218 and the drain side 1302 of the implant 1220 will be into the substrate 1202, but will be extended a distance laterally from the gate stack 1210 and/or the spacer 1218. In an embodiment, the implant 1220 is at an angle range from about 10° to about 25° from vertical or normal to the device 1200. In an embodiment, Arsenic (As) is implanted at an energy range of about 1keV to about 10keV at a dose range from about 1E14 cm-2 to about 3E15 cm-2. However, other elements, angles, energies and dosages may be used with the present disclosure.

The method 100 continues to block 108 where source/drain (S/D) spacers 1402 are formed along side of the offset spacers 1218 on the substrate 1202. See for example FIG. 10. The S/D spacers 1402 may include a dielectric material such as silicon nitride or silicon oxide. In the present embodiment, the S/D spacers 1402 include silicon nitride. The S/D spacers 1402 may be formed by depositing a spacer layer over the gate stack 1210, the offset spacers 1218, and the substrate 1202, and then performing a dry etching process on the spacers 1402.

Figure 11:
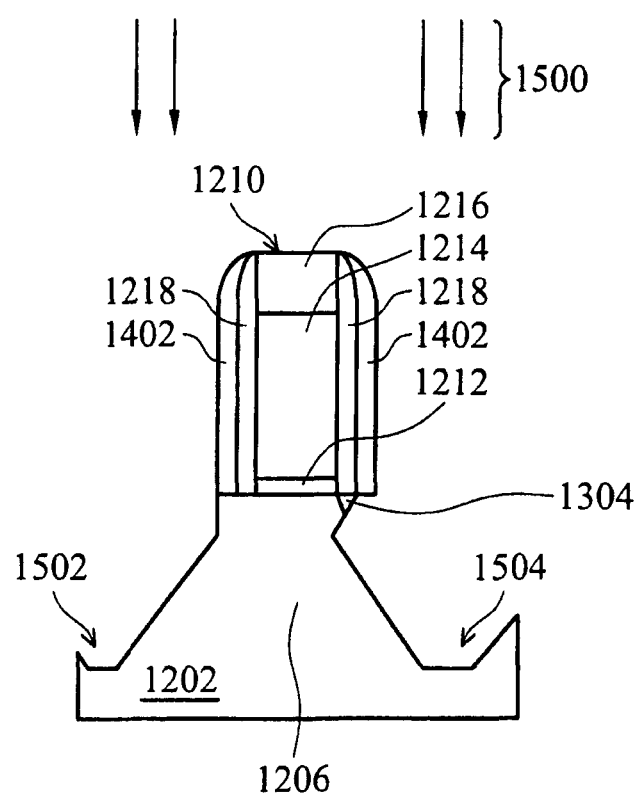

As shown in FIG. 11, the method 100 continues to block 110 where an etching process 1500 forms a recessed drain region 1502 and a recessed source region 1504 in the substrate 1202. The etching 1500 may be a combined etching process including a dry plasma etching and a wet tetra-methyl ammonium hydroxide (TMAH) etching performed using a concentration range of about 1% to about 10% at a temperature range of about 15 C to about 25 C. However, other etching processes may be used with the present disclosure. Because the sourced side implant 1304 is located partially under the offset spacer 1218 and possibly partially under the gate stack 1210 (e.g., due to the angled implant 1220) and the drain side implant 1302 is not under the spacer 1218 (e.g., due to blocking of the angled implant 1220 by the gate stack 1210, as shown in FIG. 11, the etching process 1500 etches away all of the drain side implant 1302, but leaves a portion of the source side implant 1304. The implant dopant (with etching enhancement property as mentioned above) enhances the etching rate in the source side. As such, asymmetric drain and source profiles may be formed.

Figure 12:
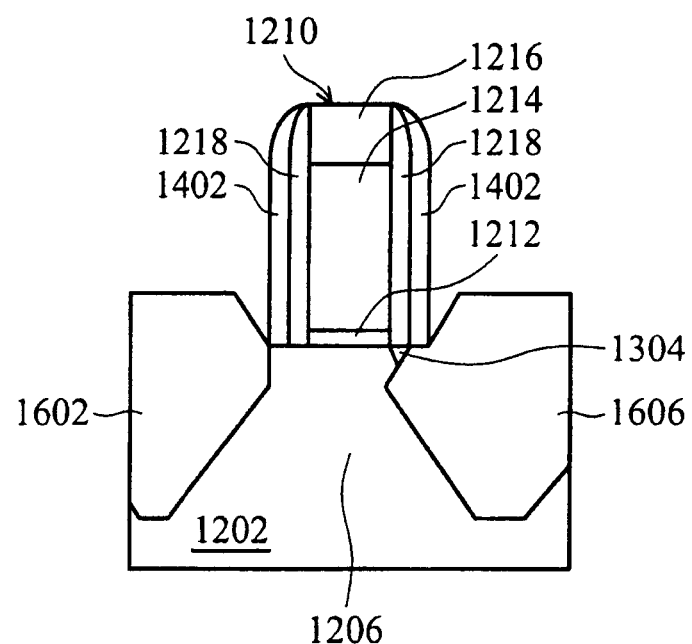
Figure 13:
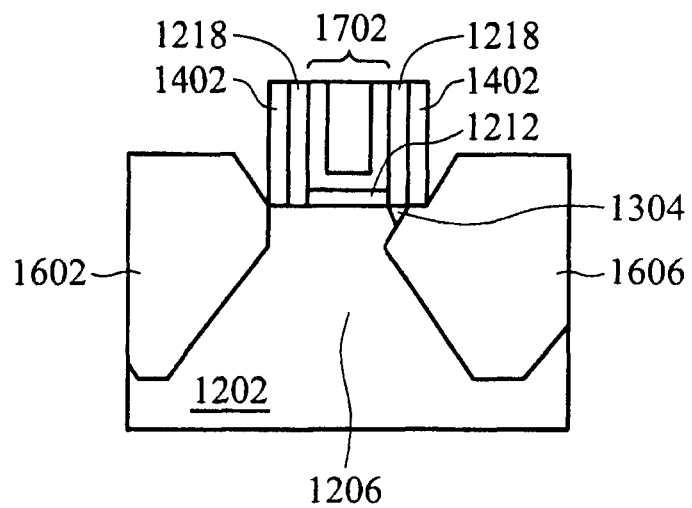

The method 100 proceeds to block 112 where strained drain layers 1602 and also strained source layers 1606 are deposited in the respective drain and source regions 1502, 1504 etched in block 110. An embodiment of this is shown in FIG. 12. It is understood that modulating strain in a transistor channel enhances electron and hole mobility and thus conductivity through the channel. Silicon germanium (SiGe) may be deposited to provide compressive strain in pFET, whereas silicon carbide (SiC) may be deposited to provide tensile strain in nFET. Other methods and systems for straining the source and drain may be used with the present disclosure. It is also pointed out that the drain layer 1602 and the source layer 1606 are asymmetric due to the asymmetric profiles formed in recess etching. In an embodiment, the drain depositions 1602 and the source depositions 1606 may be formed in block 112 when a semiconductor material is epi-grown using one or more chemical-vapor deposition (CVD) processes and may be formed using silicon germanium, silicon carbide, and/or combinations thereof. An advantage of the present embodiment is enhanced carrier mobility due to the strained feature. Additionally, the strained feature may be raised above the substrate 202, as can be seen at 1602 and 1606.

The method 100 proceeds to block 114 where at least a portion of the gate stack 1210 is removed by chemical vapor deposition (CVD) and/or by etching and a high-k metal gate 1702 is formed using high-k metal gate, gate last processes.

It should be understood that the spacers 1218 and/or 1402 may be removed by an etching process. After the spacers 1218, 1402 are etched away, lightly doped source/drain (referred to as LDD) regions may be formed in the substrate 1202 on either side of the gate stack 1210 by an ion implantation or diffusion process as is known in the art. In one embodiment, the active region 1206 may be a PMOS device, and P-type dopants such as BF2 or boron may be implanted in the PMOS device. In another embodiment, the active region 120 may be an NMOS device, and N-type dopants such as phosphorus or arsenic may be implanted in the NMOS device. A portion of the LDD regions may be formed in the silicon substrate 1202, and another portion of the LDD regions may be formed in the semiconductor material in the recess regions. It should be understood that LDD regions may be formed using the method 100 after block 102 or after block 112.

It is also to be understood that other layers may be formed over the gate stack 1210 and/or the substrate 1202 and/or the semiconductor material 1602 and/or 1606. For example, layers may be formed by CVD, ALD, or other suitable technique. The layers may include an oxide material, such as silicon oxide, silicon nitride.

It is understood that the method 100 may continue with additional steps to complete the fabrication of the semiconductor device 1200. For example, other heavy doped source/drain regions may be formed in the substrate 1202 on either side of the gate stack 1210 using ion implantation or diffusion with suitable N-type or P-type dopants. The heavy doped source/drain regions may be substantially aligned with the outer sides of the features. Silicide features may be formed on the source/drain regions and the poly layer by a salicidation process. A contact etch stop layer (CESL) may be formed over the substrate. An interlayer dielectric (ILD) layer may be formed over the CESL. In addition, contacts and interconnects may also be formed to establish electrical connections for the semiconductor device 1200.

In summary, the methods and devices disclosed herein take advantage of forming asymmetric strained source and drain regions in a silicon substrate of a semiconductor device. In doing so, the present disclosure offers several advantages over prior art devices. Advantages of the present disclosure include increased device performance (e.g., drive current & leakage) because of individually optimized asymmetrical source/drain configurations. It is understood that different embodiments disclosed herein offer different disclosure, and that they may make various changes, substitutions and alterations herein without departing from the spirit and scope of the present disclosure. For example, the embodiments disclosed herein may be implemented in a gate replacement process (or gate last process), or a hybrid process that includes a gate first process and gate last process.

What is claimed is:

1. A semiconductor device comprising:
   a silicon substrate;
   a metal gate formed on a top surface of the substrate;
   an offset spacer adjacent and physically contacting the gate on the substrate;
   a dopant implanted in the substrate to form a dopant region having a first type of dopant, wherein the dopant region extends under a portion of the offset spacer on a first side of the gate and does not extend under the offset spacer on a second, opposite side of the gate;
   a second spacer adjacent the offset spacer on the substrate, wherein the dopant region physically contacts the second spacer and the offset spacer;
   first and second source/drain (S/D) regions formed in the substrate, such that the first and second S/D regions are asymmetric with respect to the gate, wherein the first and second S/D regions are raised S/D regions having a topmost surface that is above the top surface of the substrate, wherein the first S/D region interfaces with the dopant region, wherein the second S/D region includes an epitaxial semiconductor material that continuously extends from the topmost surface of the raised S/D region of the second S/D region to directly under the offset spacer on the second side of the gate; and
   another dopant region having a second type of dopant and extending within the silicon substrate from an edge of the dopant region to an edge of the second S/D region, wherein the second type of dopant is opposite the first type of dopant, wherein the another dopant region physically contacts the offset spacer on the second side of the gate and physically contacts the gate stack.

2. The device of claim 1, wherein the dopant includes BF2 or boron.

3. The device of claim 1, wherein the dopant region that extends under the offset spacer is adjacent only one of the S/D regions, thereby merging with the one S/D region to extend it under the offset spacer.

4. The device of claim 3, wherein the dopant region that extends under the offset spacer extends along an upper surface of the substrate, adjacent the offset spacer.

5. The device of claim 1, wherein the second S/D region is positioned a distance below an upper surface of the substrate, and not adjacent the offset spacer.

6. The device of claim 1, wherein the dopant region that extends under a portion of the offset spacer has a dopant concentration of approximately 1E 14 cm-2 to approximately 3E15 cm-2.

7. The device of claim 1, wherein the epitaxial semiconductor material includes a material selected from the group consisting of SiGe and SiC.

8. A semiconductor device comprising:
   a substrate;
   a gate formed on a top surface of the substrate;
   a first offset spacer and a second offset spacer adjacent the gate on the substrate, wherein the first offset spacer is disposed along a first sidewall of the gate and the second offset spacer is disposed along a second sidewall of the gate that is opposite the first sidewall of the gate;
   a dopant implanted in the substrate to form a dopant region having a first type of dopant, wherein the dopant region extends under a portion of the first offset spacer on a first side of the gate and does not extend under the second offset spacer on a second, opposite side of the gate;
   first and second source/drain (S/D) regions having the first type of dopant formed in the substrate, such that the first and second S/D regions are asymmetric with respect to the one another, wherein the first and second S/D regions are strained S/D regions having a topmost surface that is above the top surface of the substrate, wherein the second S/D region includes an epitaxial semiconductor material that continuously extends from the topmost surface of the strained S/D region of the second S/D region to directly under the second offset spacer on the second side of the gate; and
   a second dopant region having a second type of dopant and extending continuously within the substrate from an edge of the second S/D region to an edge of the dopant region, wherein the second dopant region physically contacts the second offset spacer and the gate, wherein the second type dopant is opposite the first type dopant.

9. The device of claim 8, wherein the dopant includes BF2 or boron.

10. The device of claim 8, wherein the dopant region that extends under the first offset spacer is adjacent only one of the S/D regions, thereby merging with the one S/D region to extend it under the offset spacer.

11. The device of claim 10, wherein the dopant region that extends under the first offset spacer extends along an upper surface of the substrate, adjacent the first offset spacer.

12. The device of claim 8, wherein the second S/D region that extends under the second offset spacer on the opposite side of the gate is positioned a distance below an upper surface of the substrate, and not adjacent the second offset spacer.

13. The device of claim 8, wherein the dopant region that extends under the offset spacer has a dopant concentration of approximately 1E14 cm-2 to approximately 3E15cm-2.

14. The device of clam 8, wherein the second dopant region physically contacts the first offset spacer.

15. A semiconductor device comprising:
   a substrate;
   a gate stack formed on the substrate;
   a first sidewall spacer adjacent a first side of the gate stack;

a second sidewall spacer adjacent a second side of the gate stack that is opposite the first side;

a first doped region having a first type of dopant and extending under a portion of the first sidewall spacer on the first side of the gate stack, wherein the first doped region is formed of a first semiconductor material having the first type of dopant;

a first source/drain (S/D) region and a second S/D region formed in the substrate, wherein the first and second S/D regions are asymmetric with respect to the gate stack, wherein the first S/D region interfaces with the first doped region, wherein the first and second S/D regions have the first type of dopant, wherein the first S/D region is formed of a second semiconductor material having the first type of dopant and the second S/D region is formed of the second semiconductor material having the first type of dopant; and a second doped region having a second type of dopant and extending from an edge of the first doped region to an edge of the second S/D region, wherein the second type of dopant is opposite the first type of dopant, wherein the second doped region is formed of the first semiconductor material having the second type of dopant, wherein the second doped region physically contacts the second sidewall spacer and the gate stack.

16. The semiconductor device of claim 15, wherein the gate stack is formed on a top surface of the substrate and the first and second S/D regions are raised above the top surface of the substrate.

17. The semiconductor device of claim 15, wherein the first and second S/D regions include one of SiGe and SiC.

18. The semiconductor device of claim 15, wherein the first S/D region has an edge that physically contacts an edge of the first doped region at a first interface that is substantially coplanar with an outer edge of the first sidewall spacer, wherein the outer edge of the first sidewall spacer is substantially perpendicular to a top surface of the substrate.

19. The semiconductor device of claim 15, wherein the second S/D region extends directly under the second sidewall spacer.

20. The semiconductor device of claim 15, wherein the first S/D region has a bottommost edge extending to a first depth within the substrate and the second S/D region has a bottommost edge extending to a second depth within the substrate, wherein the first depth and the second depth are substantially equal.

* * * * *